(12) United States Patent
Bakker

(10) Patent No.: US 10,058,901 B2
(45) Date of Patent: Aug. 28, 2018

(54) DEVICE FOR REMOVAL OF PARTICLES FROM A WEB OF MATERIAL

(76) Inventor: Hermanus Bakker, Utrecht (NL)

(*) Notice: Subject to any disclaimer, the term of this patent is extended or adjusted under 35 U.S.C. 154(b) by 819 days.

(21) Appl. No.: 14/399,571

(22) PCT Filed: May 9, 2012

(86) PCT No.: PCT/NL2012/050313
§ 371 (c)(1),
(2), (4) Date: Mar. 9, 2015

(87) PCT Pub. No.: WO2013/169096
PCT Pub. Date: Nov. 14, 2013

(65) Prior Publication Data
US 2015/0174622 A1     Jun. 25, 2015

(51) Int. Cl.
*B08B 5/04* (2006.01)
*B08B 6/00* (2006.01)
(Continued)

(52) U.S. Cl.
CPC ............ *B08B 6/00* (2013.01); *B03C 7/06* (2013.01); *B08B 5/04* (2013.01); *B08B 7/04* (2013.01);
(Continued)

(58) Field of Classification Search
CPC .... B08B 6/00; B08B 5/04; B08B 7/04; B03C 7/06; B41F 23/002
See application file for complete search history.

(56) References Cited

U.S. PATENT DOCUMENTS

| 4,247,390 A | 1/1981 | Knoll |
| 5,289,774 A * | 3/1994 | Stanka ............... B41F 23/002 |
| | | 101/416.1 |
| 5,490,300 A * | 2/1996 | Horn .................. B01D 41/00 |
| | | 15/1.51 |

FOREIGN PATENT DOCUMENTS

| DE | 4102276 C1 | 7/1992 |
| GB | 1374308 A | 11/1974 |

(Continued)

OTHER PUBLICATIONS

International Search Report and the Written Opinion, dated Jan. 10, 2013, 14 pages.
(Continued)

*Primary Examiner* — Randall Chin
(74) *Attorney, Agent, or Firm* — Edell, Shapiro & Finnan, LLC

(57) ABSTRACT

In a device and method of removing particles from a surface of a web of material, a member is provided which is made from an electrically non-conducting material, and has an electrostatically chargeable and dischargeable surface. The surface is moved along a path to and from a particle removal area. In the particle removal area the member and the web of material interact which each other to transfer particles from the web of material to the charged member surface by electrostatic attraction. Upstream of the particle removal area, the member surface is electrostatically charged. Downstream of the particle removal area, a flow of air is generated over the member surface for removal of particles from the member surface, while electrically neutralizing the member surface and particles on the member surface. The member comprises a hollow member cylinder, having a chargeable and dischargeable outer surface movable along a circular path by rotating the member cylinder around an axis.

12 Claims, 2 Drawing Sheets

(51) Int. Cl.
*B03C 7/06* (2006.01)
*B41F 23/00* (2006.01)
*H05K 3/38* (2006.01)
*B08B 7/04* (2006.01)
*H05K 3/12* (2006.01)

(52) U.S. Cl.
CPC ........... *B41F 23/002* (2013.01); *H05K 3/381* (2013.01); *B03C 2201/20* (2013.01); *H05K 3/1208* (2013.01)

(56) References Cited

FOREIGN PATENT DOCUMENTS

| | | | | | |
|---|---|---|---|---|---|
| GB | 2252153 | A | * | 7/1992 | ............... B08B 6/00 |
| WO | 9828080 | A1 | | 7/1998 | |
| WO | WO 9828080 | A1 | * | 7/1998 | ............. B03B 9/061 |

OTHER PUBLICATIONS

International Preliminary Report on Patentability, dated Jun. 13, 2014, 8 pages.

\* cited by examiner

DEVICE FOR REMOVAL OF PARTICLES FROM A WEB OF MATERIAL

FIELD OF THE INVENTION

The invention relates to the field of removal of particles, in particular dust particles, from a surface of a web of material. More specifically, the invention relates to a device for removal of particles from a moving web of material.

The particles to be removed from the surface of the web of material are dust particles or any other loose particles which are not desired to be present on the surface. The particles are assumed to be electrostatically chargeable.

BACKGROUND OF THE INVENTION

During processing of electrically non-conductive webs of material, including sheets of material, static electricity may be generated. The web of material may be made from paper or be paper-based, may be made from a plastic or other synthetic singular or compound material, like foil material, or may be a fabric, such as a fabric from said materials, or may be a combination thereof. Thus, the web of material may or may not be flexible, and the web of material may be endless, may have a large length, or may have a relatively small length, for example a printed circuit board. The web of material may be a carrier of other webs of material.

The static electrical charges, resulting from a generation of static electricity, at the surface of the web of material attract particles, such as dust particles, in the vicinity of the surface. Such particles adhere to the surface and thereby deteriorate the surface quality, and make the web of material less suitable or unsuitable for further processes to be carried out at the surface, such as printing on the surface, laminating, etc. Accordingly, a need exists to remove the particles from the web surface.

Reference DE 4102276 discloses removal of dust from a web of material. For a neutralization of electrostatic charges at the web, a high voltage electrode is provided near the web. At least one web-like member made from a synthetic material which is movable and guided by guide rollers, has at least a part extending parallel to the web of material. The member may be electrostatically charged by means of a further high voltage electrode to generate an electric field between the member and the web of material. Along the path of the member, downstream relative to the part of the path extending parallel to the web of material, a vacuum cleaner device is arranged to remove the dust from the synthetic material web by suction.

In the device as disclosed in the reference, a problem exists in that in operation the web-like member, when moving along the guide rollers, is subjected to varying mechanical stresses which lead to a limited lifetime of the member. Another problem is the limited length of the member as seen in the longitudinal direction of the guide rollers to retain a stably operating configuration, thereby limiting a width of webs of material to be cleaned, or necessitating a costly use of a plurality of devices when cleaning a large width web of material. A further problem may be recognized in that the charging of the web-like member is poorly controllable by the configuration of the further high voltage electrode. A still further problem is the relatively complicated mechanical construction of the particle removal device.

SUMMARY OF THE INVENTION

It would be desirable to provide a particle removal device having a member which diminishes or removes the above disadvantages. It would also be desirable to obtain an improved charging of the member. It would also be desirable to provide a particle removal device have a simplified mechanical construction.

To better address one or more of these concerns, in a first aspect of the invention a device for removing particles from a surface of a web of material is provided. The device comprises a member made from an electrically non-conducting material, and having an electrostatically chargeable and dischargeable surface which is movable along a path to and from a particle removal area, wherein the particle removal area is configured for interaction between the member and the web of material to transfer particles from the web of material to the charged member surface by electrostatic attraction. The device further comprises a charging device arranged along the path of the member surface upstream of the particle removal area for charging the member surface, and a vacuum cleaning device arranged along the path of the member surface downstream of the particle removal area, wherein the vacuum cleaning device is configured to generate a flow of air over the member surface for removal of particles from the member surface, the vacuum cleaning device comprising an ionization device configured for neutralizing the member surface and particles on the member surface. The member comprises a hollow member cylinder which is rotatable around an axis, wherein said surface is an outer surface of the member cylinder and said path is circular.

The particle removal device according to the present invention comprises a cylinder made from an electrically non-conducting material. A web of material may be guided along at least part of the cylinder surface in a direction at right angles to the cylinder axis. The cylinder provides a light-weight, yet stiff structure of which different angular sections can be charged and discharged, respectively. The cylinder provides an endless surface when seen in the direction of rotation, so that the particle removal may be implemented in a continuous process. The cylinder can be made in a substantial length, suitable for even the widest webs of material.

In an embodiment, the charging device comprises: outside the member cylinder, a first charge generating device configured for generating electrical charges; and inside the member cylinder, a counter-electrode made from an electrically conducting material, and arranged opposite to the first charge generating device. Such configuration allows for accurately directing the electrical charges generated by the first charge generating device to a predetermined area of the outer surface of the member cylinder, thereby optimizing the efficiency of the charging device.

In operation, the predetermined area of the outer surface of the member cylinder receives the charges and, when the member cylinder rotates, retains or holds these charges while taking the charges along to, and through the particle removal area. The counter-electrode may have a fixed location inside the member cylinder. The counter-electrode may contact an inner surface of the member cylinder.

In an embodiment, the counter-electrode comprises a cylinder rotatable around an axis parallel to the member axis, the counter-electrode cylinder being arranged at an inner surface of the member cylinder. In particular, the counter-electrode cylinder may be rotatable, and may be configured to be in contact with the inner surface of the member cylinder. The counter-electrode may be freely rotatable. The counter-electrode may be driven in rotation by the member cylinder. Inversely, the counter-electrode cylinder may be driven, and may be configured to be in contact with the inner surface of the member cylinder to drive the member cylinder in rotation. Driving forces between the counter-electrode cylinder and the inner surface of the member cylinder are transmitted by friction.

In another embodiment, the counter-electrode comprises a stationary element of conducting material having a surface, advantageously a low friction surface, configured to be in contact with the inner surface of the member cylinder.

In an embodiment, the particle removal device further comprises a second charge generating device arranged at the particle removal area outside the member cylinder. With the second charge generating device, the transfer of particles from the side of the web of material facing the member cylinder to the outer surface of the member cylinder is enhanced, in particular when the first charge generating device and the second charge generating device are configured to generate charges of the same polarity.

In an embodiment, the member cylinder comprises fibers embedded in a synthetic material. Such material composition fulfills the requirements of light weight and high stiffness of the member cylinder excellently. In an embodiment, the fibers comprise glass fibers and/or other electrically non-conducting (isolating) fibers, which provide a long life-time when subjected to the frequent charging/discharging processes in the device of the present invention.

In another embodiment, the member cylinder comprises a homogeneous, electrically non-conducting material having appropriate material properties for its purpose.

In an embodiment, the outer surface of the member cylinder is provided with a coating, wherein the coating may comprise a rubber material. The coating material is highly isolating (non-conducting) to ensure that charge deposited on the outer surface of the member cylinder may be substantially retained or held during at least a part of a revolution of the member cylinder, in particular at least half a revolution of the member cylinder, taking into account a speed of rotation or a revolution time of the member cylinder. The coating material may provide increased resistance to wear of the member cylinder outer surface due to mechanical influences, electrical influences of charging and discharging, and chemical influences of charging and discharging, in particular taking into account the ozone gas generated thereby. The coating material may be advantageous to provide sufficient friction when the member cylinder is freely rotatable, and is configured to be driven in rotation by the web of material contacting the member cylinder outer surface. The coating material may further protect the material of the member cylinder against temperature influences, such as heat or cold input from the web of material contacting the member cylinder outer surface.

In a second aspect of the invention, an assembly of a first particles removing device and a second particles removing device is provided, wherein the first particles removing device and the second particles removing device are configured to be located at opposite sides of the web of material.

In a third aspect of the invention, a method of removing particles from a surface of a web of material is provided. The method comprises: providing a member made from an electrically non-conducting material, and having an electrostatically chargeable and dischargeable surface; moving the surface along a path to and from a particle removal area, wherein in the particle removal area the member and the web of material interact with each other to transfer particles from the web of material to the charged member surface by electrostatic attraction; upstream of the particle removal area, electrostatically charging the member surface; and downstream of the particle removal area, generating a flow of air over the member surface for removal of particles from the member surface, while electrically neutralizing the member surface and particles on the member surface. The member comprises a hollow member cylinder, wherein said surface is an outer surface of the member cylinder and said path is circular. The method further comprises rotating the member cylinder around an axis.

These and other aspects of the invention will be more readily appreciated as the same becomes better understood by reference to the following detailed description and considered in connection with the accompanying drawings in which like reference symbols designate like parts.

Herein, the term 'electrically non-conducting' is to be understood as meaning 'having such low electrical conductivity that it is suitable for the intended purpose as explained in this specification'.

DETAILED DESCRIPTION OF EMBODIMENTS

Figure 1:
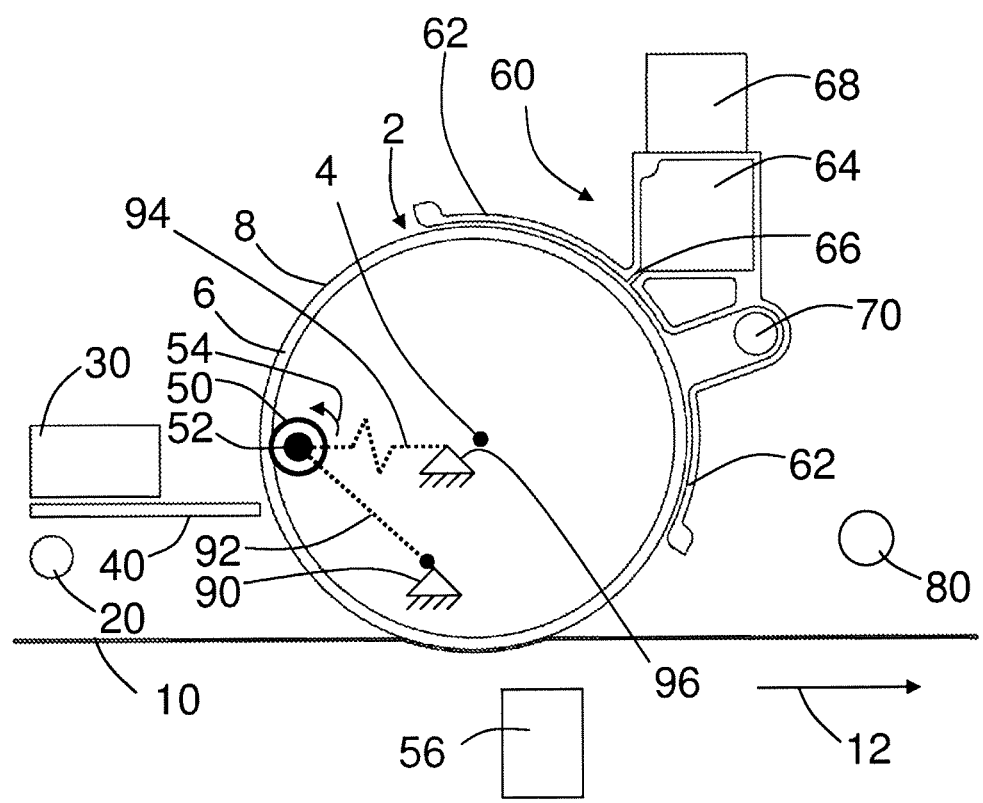
FIG. 1 schematically depicts a side view, partially in cross-section, of an embodiment of a device according to the present invention, configured to remove particles from a surface of a web of material.

FIG. 1 schematically depicts a side view of a hollow cylinder-shaped member 2 (the member 2 being shown in cross-section) which is rotatable around an axis 4. The member 2 further has an outer radius, and an inner radius. For rotation, the member 2 may be mounted in a frame, such as mounted at its ends in a frame, in a manner known per se, and not shown in FIG. 1. The member 2 comprises a cylinder 6 made from an electrically non-conducting material. The member 2 may be provided with a coating 8 from an electrically non-conducting material at its outer circumference. The cylinder 6 may be made from fibers embedded in a synthetic matrix, such as glass fibers or other non-conducting fibers embedded in a cured resin. The coating 8 may comprise a rubber material. The coating 8 preferably is continuous across the outer surface of the cylinder 6. In some embodiments, the coating 8 may be discontinuous across the outer surface of the cylinder 6, such as provided in rings around the circumference of the cylinder 6. Functions of the coating 8 include: receiving and retaining or holding electrical charges on a part of the cylinder 6, providing resistance against mechanical wear of the cylinder 6, providing resistance against electrical wear of the cylinder 6 due to continuous charging and discharging of part of the cylinder surface, providing resistance against chemical wear of the cylinder 6 due to reactive gases such as ozone generated by continuous charging and discharging of part of the cylinder 6, and protecting a part of the cylinder 6 lying under the coating 8 against heat or cold radiated or conveyed to the outer surface of the cylinder 6, such as by mechanical contact between a web of material 10 and the outer surface of the cylinder 6.

The member 2 preferably is arranged to locally contact a web of material 10 moving in a direction of arrow 12. In such an embodiment, when the member 2 is freely rotatable, the web of material 10 may drive the member 2 at its outer circumference to rotate the member 2 in the direction of arrow 12 around the axis 4, by virtue of an attraction force between the coating 8 and the web of material 10. The rubber material of the coating 8 provides for a reliable and sufficient generation of friction when being contact with the web of material.

In another embodiment, a small distance, preferably less than about 0.1 m, between the outer surface of the member 2 and the web of material 10 may exist, such that the member 2 does not contact the web of material 10. In such an embodiment, the member 2 may be driven by a motor not shown in detail to rotate the member 2 in the direction of arrow 12 around the axis 4. An embodiment of the web of material 10 not contacting the outer surface of the member 2 may be advantageous when the web of material is resilient, when this resiliency otherwise (when the web of material 10 drives the member 2 by contact) would result in overtensioning and/or undertensioning part(s) of the web of material. The distance should be large enough to avoid the web of material being drawn against the outer surface of the member 2 by electrostatic attraction forces, while at the same time the distance should be small enough to allow the member 2 to remove particles from the surface of the web of material 10.

Further, in an embodiment having a small distance between the outer surface of the member 2 and the web of material 10, the circumferential speed of the member 2 may be substantially the same as a speed of displacement of the web of material 10. In some embodiments, the circumferential speed of the member 2 is different from (i.e. lower than, or higher than) the speed of displacement of the web of material. In the embodiments wherein the member 2 does not contact the web of material 10, the coating 8 may be omitted.

The member 2, comprising the cylinder 6, may be made as a stiff, yet lightweight body, even when it has a considerable length (where length is the dimension in the longitudinal direction of the axis 4). Since the member 2 extends transversely to the direction of conveyance of the web of material 10, the length of the member 2 should be at least sufficient to cover the width of the web of material 10.

The path of the (outer surface of the) member 2 has an upstream section where, for a particular point on the outer surface of the member 2, upon rotation of the member 2 in its direction of rotation as indicated by arrow 12, the distance between said point on the outer surface of the member 2 and the web of material 10 decreases. Similarly, the path of the (outer surface of the) member 2 has a downstream section where, for a particular point on the outer surface of the member 2, upon rotation of the member 2 in its direction of rotation as indicated by arrow 12, the distance between said point on the outer surface of the member 2 and the web of material 10 increases. In a transitional area between the upstream section and the downstream section of the path of the outer surface of the member 2, the distance between (a point on) the outer surface of the member 2 and the web of material is zero (when the web of material 10 contacts the member 2) or at a minimum (when the web of material 10 is near or nearest to the outer surface of the member 2).

Likewise, the path of the web of material 10 has an upstream part, and a downstream part, when seen in its direction of movement as indicated by arrow 12. In a transitional area between the upstream part and the downstream part of the path of the web of material 10, the distance between (a point on) the outer surface of the member 2 and the web of material is zero (the web of material 10 contacts the member 2) or at a minimum (the web of material 10 is near or nearest to the outer surface of the member 2). The transitional area may be referred to as a particle removal area, since here particles are removed from the web of material 10 by the charged outer surface of the cylinder 6 for the particles to be transferred to the outer surface of the cylinder 6.

At the upstream part of the path of the web of material 10, a schematically shown first ionization device 20 is arranged in a manner not shown in greater detail in a stationary way, such as mounted in a frame not shown in detail. The first ionization device 20 produces negative and positive ions by corona discharge ionization in the atmosphere surrounding the first ionization device 20, in particular the atmosphere extending to the surface of the web of material 10 facing the first ionization device 20. With the ions reaching the surface of the web of material 10 at the upstream part of the path thereof, the surface becomes neutralized as any charges existing thereon and therein combine with oppositely charged ions. Accordingly, the first ionization device 20 may also be referred to as a discharging device.

At the upstream section of the path of the member 2, a schematically shown first charge generating device 30 is arranged in a manner not shown in greater detail, such as mounted in a frame not shown in detail. The first charge generating device 30 is configured to generate negative charges (such as electrons) or positive charges by corona discharge ionization in the atmosphere surrounding the first charge generating device 30, in particular the atmosphere extending to the surface of the member 2 facing the first charge generating device 30. With an operation of the first charge generating device 30, the surface of the member 2 becomes negatively or positively charged locally. This charge does not spread, since the material of the member 2 is electrically non-conducting.

Between the first ionization device 20 and the first charge generating device 30, a schematically shown electrically isolating structure 40 is arranged in a manner not shown in greater detail, such as mounted in a frame not shown in detail. The electrically isolating structure 40 separates the first ionization device 20 from the first charge generating device 30, such that charges generated by the first ionization device 20 do not substantially combine with the charges generated by the first charge generating device 30 to weaken the charging of the surface of the member 2, whereas the charges generated by the first charge generating device 30 do not substantially combine with the charges generated by the first ionization device 20 to weaken the discharging of the web of material 10. Further, the electrically isolating structure 40 prevents the charges generated by the first ionization device 20 to decrease the charge of the surface of the member 2.

Inside the member 2, at an inner surface of the cylinder 6, a schematically shown counter-electrode 50 is arranged in a manner not shown in greater detail, such as mounted in a frame not shown in detail. The counter-electrode 50 is arranged opposite to the first charge generating device 30, and is kept at neutral potential or earth potential. The counter-electrode 50 is at least partly made from an electrically conducting material, and preferably comprises a metal cylinder, such as a steel cylinder. In some embodiments, the cylinder is coated with a metal having a high conductivity, such as copper.

The counter-electrode 50 promotes the charges generated by the first charge generating device 30 to move to the surface of the member 2 in the area between the first charge generating device 30 and the counter-electrode 50.

The counter-electrode 50 may be stationary, or may be rotatable around a central axis 52. The counter-electrode 50 is configured to be in contact with the inner surface of the cylinder 6. When the counter-electrode 50 is rotatable around the axis 52, the counter-electrode 50 may be mounted to rotate freely around the axis 52 to reduce wear due to mechanical contact between the counter-electrode 50 and the inner surface of the cylinder 6. A friction between the outer surface of the counter-electrode 50 and the inner surface of the cylinder 6 may drive the counter-electrode 50 in rotation in a direction of arrow 54 when the member 2 rotates in the direction of arrow 12. The counter-electrode 50 may be biased against an inner surface of the cylinder 6 using its own weight and the force of gravity in a lever mechanism using one or more levers 92 coupled between the axis 52 and a stationary support 90, where the lever(s) 92 is/are rotatably coupled to the stationary support 90a. In another embodiment, the counter-electrode 50 may be biased against an inner surface of the cylinder 6 using one or more springs 94 coupled between the axis 52 and a stationary support 96, the spring(s) 94 pushing the counter-electrode against the inner surface of the cylinder 6.

When the counter-electrode 50 is stationary, it may be implemented as an electrically conducting bar having a low-friction surface touching the inner surface of the member 2, opposite to the first charge generating device 30.

At the transitional area between the upstream section and the downstream section of the path of the member 2, and at an opposite side of the web of material 10, a schematically shown second charge generating device 56 is arranged in a manner not shown in greater detail, such as mounted in a frame not shown in detail. In particular, the second charge generating device 56 may be mounted near a location in the downstream part of the path of the web of material 10 where the web of material 10 gets out of contact from the member 2. The second charge generating device 56 is configured to generate negative charges (such as electrons) or positive charges by corona discharge ionization in the atmosphere surrounding the second charge generating device 56, in particular in the atmosphere extending to the surface of the member 2 facing the second charge generating device 56 or, when a web of material 10 is present, in the atmosphere extending to the side or surface of the web of material 10 facing away from the member 2. With an operation of the second charge generating device 56, the side or surface of the web of material 10 facing away from the member 2 becomes negatively or positively charged locally, depending on the configuration of the second charge generating device 56.

The configurations of the first charge generating device 30 and the second charge generating device 56 are such that the polarities of the charges generated by the first charge generating device 30 and the second charge generating device are the same.

At the downstream section of the path of the member 2, a vacuum cleaning device 60 is arranged in a stationary way and in a manner not shown in greater detail, such as mounted in a frame not shown in detail, fixing the position of the vacuum cleaning device 60 with respect to the cylinder 6. The vacuum cleaning device 60 comprises a hood 62 extending over an angular section of the member 2, at a relatively low distance above the surface of the member 2. The angular section may be between 60° and 150°. Air is drawn away from under the hood 62 to a chamber 64 through a series of openings or a slit 66, by creating a (partial) vacuum in the chamber 64 using a pump not shown in detail. The air drawn away from under the hood 62 is mechanically discharged through an outlet 68. In the outlet 68, a filtering device, preferably a self-cleaning filtering device, may be comprised to remove and capture particles present in the air flowing through it.

At the downstream section of the path of the member 2, under the hood 62 of the vacuum cleaning device 60, a second ionization device 70 is arranged in a manner not shown in further detail. The second ionization device 70 is configured to generate positive and negative ions to neutralize any charged particles present on the surface of the member 2 to facilitate their removal from the surface of the member 2 by the air flow generated by the vacuum cleaning device 60. The second ionization device 70 may comprise a brush, a roll or other suitable ionization construction.

Optionally, at the downstream part of the path of the web of material, a third ionization device 80 may be arranged in a manner not shown in further detail, to neutralize the web of material 10.

It is noted that the ionization device 20, the first charge generating device 30, the electrically isolating structure 40, the counter-electrode 50, the second charge generating device 56, the vacuum cleaning device 60, the second ionization device 70 and the third ionization device 80 all extend substantially along the entire length of the member 2 (at right angles to the plane of the drawing) to be operative along the entire length of the member 2, and thus along the entire width of the web of material 10.

In operation, the web of material 10 is fed to the member 2. The web of material 10 is moving in the direction of arrow 12. The member 2 is rotating around axis 4 in the direction of arrow 12. The first ionization device 20 neutralizes any charges present on and in the surface of the web of material 10 facing the first ionization device 20, upon passing of the web of material 10. In the upstream section of the path of the member 2, the first charge generating device 30 provides charges on the surface of the member 2 passing the first charge generating device 30. These charges are retained until the surface of the member 2 is at the lowest distance to the web of material 10, or (as illustrated in FIG. 1) contacting the web of material 10. Upon a contact, the web of material 10 may electrostatically adhere to the member 2 over some length, as illustrated in FIG. 1. When the web of material 10 passes the charged surface of the member 2, particles present on the surface of the web of material 10 will be attracted to, and move to the surface of the member 2 and adhere to it. If the web of material 10 is in contact with the member 2, as illustrated in FIG. 1, then in the downstream part of the path of the web of material 10, starting from the moment the web of material 10 gets out of contact from the member 2, particles present on the surface of the web of material 10 will be attracted to, and move to the member 2, and adhere to it. The second charge generating device 56 promotes the particles present on the side or surface of the web of material 10 facing away from the second charge generating device 56 to move to the member 2. If the web of material 10 is not in contact with the member 2, the circumferential speed of the member 2 may be equal to, or different from the speed of conveyance of the web of material 10, to reach an optimum efficiency of removal of the particles from the surface of the web of material 10.

The charges produced by the first charge generating device 30 and the second charge generating device 56 may be variable to be set according to material properties of the web of material 10 or the particles to be removed.

The member 2, on further rotation, conveys the particles adhered to its surface to the operational area of the vacuum cleaning device 60. By virtue of the small distance between the surface of the member 2 and the hood 62, a strong flow of air is generated under the hood 62 towards the openings or slit 66. In this flow of air, particles not adhering strongly to the member 2 will be taken along and will be removed from the surface of the member 2. Particles adhering strongly to the member 2 when arriving under the hood 62, are neutralized in the operational area of the second ionization device 70, and thereby are easily removed from the surface of the member 2 by the air flow under the hood 62. Also, the second ionization device 70 discharges the surface of the member 2. The angular extension of the hood 62 over the surface ensures that there is sufficient time for the flow of air under the hood 62 to remove substantially all particles taken under the hood 62 by the member 2. It is noted that for the same purpose the hood 62 does not only angularly extend upstream (when seen in the direction of rotation of the member 2) of the openings or slit 66, but also angularly extends downstream of the openings or slit 66.

After passage of the hood 62, in particular after passage of the second ionization device 70, the surface of the member 2 is discharged, substantially cleaned from particles, and neutral. Then, on arriving again in the operational area of the first charge generating device 30, the surface of the member is charged again, and the process continues as described above.

If present, the third ionization device 30 is configured to remove or neutralize any remaining charges on or in the web of material 10, before it is processed further.

Figure 2:
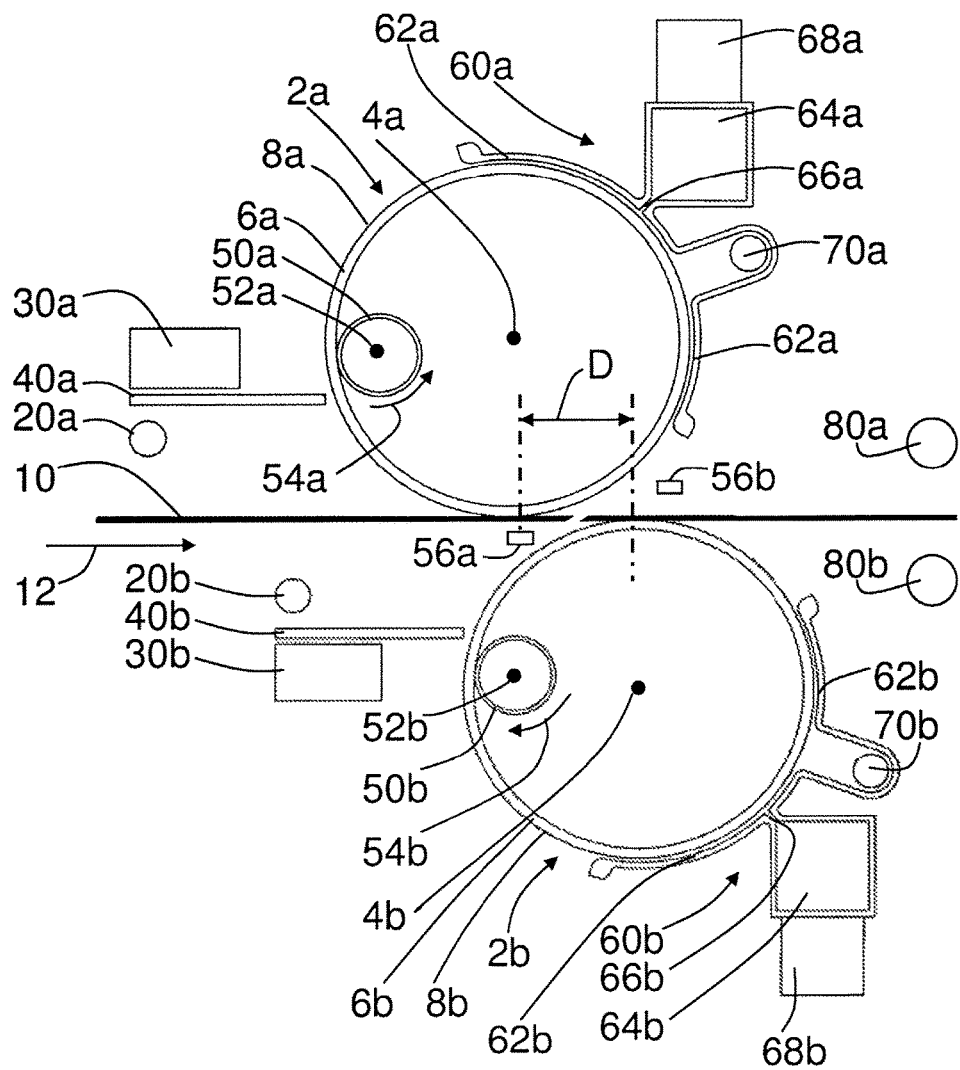
FIG. 2 schematically depicts a side view, partially in cross-section, of another embodiment of a device according to the present invention, configured to remove particles from opposite surfaces of a web of material.

FIG. 2 illustrates a double configuration of the device of FIG. 1. In FIG. 2, similar or the same components are shown as in FIG. 1, having the same reference numerals, where a suffix "a" or "b" of the reference numeral is used to identify components belonging to the 'a'-configuration on one side of the web of material 10, or belonging to the 'b'-configuration on the other side of the web of material. With the double configuration, particles may be removed from two opposite surfaces of the web of material 10 at the same processing. In such a double configuration, a distance D measured along the length of the web of material 10 between the axis 4a of the 'a'-configuration and the axis 4b of the 'b'-configuration is (as indicated by an interruption in the web of material 10) at least equal to the diameter of the member 2a or 2b, to avoid the operative member 2a adversely influencing the operative member 2b, and to avoid the operative member 2b adversely influencing the operative member 2a. In a double configuration, the first charge generating device 30a of the 'a'-configuration will charge the member 2a to an polarity opposite to the polarity to which the first charge generating device 30b of the b'-configuration will charge the member 2b, to further avoid an adverse mutual influence between the operative members 2a and 2b.

In the particle removing device, the ionization device 20, the first charge generating device 30, the electrically isolating structure 40, the vacuum cleaning device 60 including the second ionization device 70, and the third ionization device 80 may be adjustable in their position to allow to reach an optimum functioning of the particle removing device for a particular application, such as for a particular web of material 10 travelling at a particular speed.

As explained above, in a device and method of removing particles from a surface of a web of material, a member is provided which is made from an electrically non-conducting material, and has an electrostatically chargeable and dischargeable surface. The surface is moved along a path to and from a particle removal area. In the particle removal area the member and the web of material interact which each other to transfer particles from the web of material to the charged member surface by electrostatic attraction. Upstream of the particle removal area, the member surface is electrostatically charged. Downstream of the particle removal area, a flow of air is generated over the member surface for removal of particles from the member surface, while electrically neutralizing the member surface and particles on the member surface. The member comprises a hollow cylinder, having a chargeable and dischargeable outer surface movable along a circular path by rotating the member cylinder around an axis.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting, but rather, to provide an understandable description of the invention.

The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language, not excluding other elements or steps). Any reference signs in the claims should not be construed as limiting the scope of the claims or the invention.

The mere fact that certain measures are recited in mutually different dependent claims does not indicate that a combination of these measures cannot be used to advantage.

The invention claimed is:

1. A device for removing particles from a surface of a web of material, the device comprising:
   a member made from an electrically non-conducting material, and having an electrostatically chargeable and dischargeable surface which is movable along a path to and from a particle removal area, wherein the particle removal area is configured for interaction between the member and the web of material to transfer particles from the web of material to the charged member surface by electrostatic attraction;
   a charging device arranged along the path of the member surface upstream of the particle removal area, wherein the charging device is configured for charging the member surface; and
   a vacuum cleaning device arranged along the path of the member surface downstream of the particle removal area, wherein the vacuum cleaning device is configured to generate a flow of air over the member surface for removal of particles from the member surface, the vacuum cleaning device comprising an ionization device configured for neutralizing the member surface and particles on the member surface,
   wherein the member comprises a hollow member cylinder which is rotatable around an axis, wherein said member surface is an outer surface of the member cylinder and said path is circular; and
   the charging device comprises:
   outside the member cylinder, a first charge generating device for generating electrical charges; and
   inside the member cylinder, a counter-electrode configured to be in mechanical contact with the inner surface of the member cylinder, wherein the counter-electrode is made at least partly from an electrically conducting material, is configured to be kept at neutral potential or earth potential, and is arranged opposite to the first charge generating device, for directing the electrical charges generated by the first charge generating device to a predetermined area of the outer surface of the member cylinder.

2. The device of claim 1, wherein the counter-electrode comprises a cylinder rotatable around an axis parallel to the member axis.

3. The device of claim 2, wherein the counter-electrode is mounted to rotate freely around the axis.

4. The device of claim 2, wherein the counter-electrode is biased against an inner surface of the member cylinder using its own weight and the force of gravity in a lever mechanism using one or more levers coupled between the axis and a stationary support, where the one or more levers are rotatably coupled to the stationary support.

5. The device of claim 2, wherein the counter-electrode is biased against an inner surface of the member cylinder using one or more springs coupled between the axis and a stationary support, the one or more springs pushing the counter-electrode against the inner surface of the member cylinder.

6. The device of claim 1, further comprising a second charge generating device arranged at the particle removal area outside the member cylinder.

7. The device of claim 6, wherein the first charge generating device and the second charge generating device are configured to generate charges of the same polarity.

8. The device of claim 1, wherein the member cylinder comprises fibers embedded in a synthetic material.

9. The device of claim 8, wherein the fibers comprise glass fibers.

10. The device of claim 1, wherein the outer surface of the member cylinder is provided with a coating.

11. The device of claim 10, wherein the coating comprises a rubber material.

12. The device of claim 1, wherein the member cylinder is freely rotatable, and is configured to be driven in rotation by the web of material contacting the member cylinder outer surface.

* * * * *